United States Patent [19]

LaBelle, Jr. et al.

[11] 4,028,059

[45] June 7, 1977

[54] MULTIPLE DIES FOR RIBBON

[75] Inventors: Harold E. LaBelle, Jr., Hanover; Charles J. Cronan, Taunton, both of Mass.

[73] Assignee: Tyco Laboratories, Inc., Waltham, Mass.

[22] Filed: Oct. 12, 1976

[21] Appl. No.: 731,948

Related U.S. Application Data

[63] Continuation-in-part of Ser. No. 641,744, Dec. 18, 1975, abandoned.

[52] U.S. Cl. .......................... 23/273 SP; 156/608; 156/617 SP; 164/337; 164/361; 249/107

[51] Int. Cl.² ..................... B01J 17/18; B22C 9/08; B22D 39/00

[58] Field of Search ................ 23/273 SP; 156/608, 156/617 SP; 425/248, 464, 463, 462, 66, 131.1; 249/107; 164/337, 60, 361

[56] References Cited

UNITED STATES PATENTS

| | | | |
|---|---|---|---|
| 3,241,925 | 3/1966 | Van Cakenberghe | 23/273 SP |
| 3,245,112 | 4/1966 | Williamson | 425/464 X |
| 3,687,633 | 8/1972 | LaBelle, Jr. et al. | 23/273 SP |
| 3,953,174 | 4/1976 | LaBelle, Jr. | 23/273 SP |

*Primary Examiner*—Wilbur L. Bascomb, Jr.
*Assistant Examiner*—Barry I. Hollander
*Attorney, Agent, or Firm*—Schiller & Pandiscio

[57] ABSTRACT

The invention is an improvement in apparatus for growing crystalline bodies from the melt. The apparatus comprises a crucible and a novel die assembly in which the die assembly is made in two parts and essentially comprises inner and outer concentric members. The inner and outer members are spaced from one another to define an annular lower capillary section. One member is longer than the other and is shaped so that its upper end overhangs and engages the upper end of the other member. A plurality of upstanding dies are formed in the upper end of the longer member. Each of the dies has a top end surface and is slotted in a generally radial direction with the slots being deep enough to intersect the annular space between the two members. The slots in the dies serve as capillaries to provide communication between the lower capillary section and the top end surfaces of the dies.

20 Claims, 7 Drawing Figures

MULTIPLE DIES FOR RIBBON

The present application is a continuation-in-part of our copending U.S. patent application Ser. No. 641,744, filed Dec. 18, 1975, for Multiple Dies for Ribbon, now abandoned.

This invention relates to apparatus for growing crystalline bodies from the melt and more particularly to dies for growing crystals according to the EFG process.

Various systems have been developed for growing monocrystalline bodies from a melt. The present invention pertains to an improvement in growing monocrystalline bodies from a melt according to what is called the edge-defined film-fed growth technique (also called the "EFG Process"). Details of the EFG process are described in U.S. Pat. No. 3,591,348, issued July 6, 1971 to Harold E. LaBelle, Jr., for METHOD OF GROWING CRYSTALLINE MATERIALS, and U.S. Pat. No. 3,687,633, issued Aug. 29, 1972 to Harold E. LaBelle, Jr., et al for APPARATUS FOR GROWING CRYSTALLINE BODIES FROM THE MELT.

In the EFG process the shape of the crystalline body is determined by the external or edge configuration of the end of a capillary forming member which for want of a better name is called a die. An advantage of the process is that bodies of selected shapes such as flat ribbons can be produced commencing with the simplest of seed crystal geometries, namely, a round small diameter seed crystal. The process involves growth on a seed from a liquid film of feed material sandwiched between the growing body and the end surface of the die, liquid in the film being continuously replenished from a suitable melt reservoir via one or more capillaries in the die member. Among materials that have been grown by the EFG Process as monocrystalline bodies are $\alpha$-alumina (sapphire), spinel, chrysoberyl, barium titanate, lithium niobate, yttrium aluminum garnate and silicon.

Essential requirements of the EFG Process are that the crucible and die member must be made of a composition that will withstand the operating temperature and also will not react with the melt. Additionally, the die member must be wettable by the melt. Only a limited number of materials meet these aforesaid requirements and typically such materials are metals and alloys which are difficult to machine, and often are relatively costly. For example, the dies and crucibles used in growing monocrystalline $\alpha$-alumina or sapphire crystals usually are made of molybdenum, tungsten or iridium, all of which are quite difficult to machine. This is especially so in the case of die members used to grow shaped crystals to close tolerences since the capillaries and film-supporting end surfaces must also be made to close tolerences.

In order to increase production capability it has been proposed to dispose a number of individually formed dies in a single crucible. However, dies of the type heretofore used are expensive to produce. Also it is difficult to mount a large number of such dies to a single crucible without unduly increasing the size of the crucible. As a result, production costs even on a commercial scale typically have remained somewhat high.

It is thus a primary object of the present invention to provide an improved apparatus for multiple growth of crystalline bodies from the melt.

Another object is to provide a new and improved crucible-die assembly for growing crystalline bodies by the EFG process which has a greater production capability in comparison with prior crucible-die assemblies.

Still another object is to provide a novel crucible-die assembly for growing a plurality of crystalline bodies from the melt by the EFG process, which is relatively simple to manufacture and requires a minimum of machine operations.

Described briefly, the invention whereby the foregoing objects are achieved comprises a novel die assembly which is adapted to be mounted in a crucible and essentially comprises inner and outer concentric members. These members are spaced radially from one another to define a lower capillary section and are held in their concentric and spaced relation by one or more locating bosses. The inner member is provided with one or more slots at its bottom end to permit melt to flow from the interior of the crucible into the annular space between the inner and outer members. One member is longer than the other and is shaped so that its upper end overhangs and engages the upper end of the other member. A plurality of upstanding dies are formed in the upper end of the longer sleeve. Each of the dies has a top end surface and is slotted in a generally radial direction with the slots being deep enough to intersect the annular space between the two members. The slots in the die are also sized to serve as capillaries and thereby provide communication between the lower capillary section and the top end surface of the die.

Other features and many of the attendant advantages of the invention are set forth or rendered obvious by the following detailed description which is to be considered together with the accompanying drawings wherein like members denote similar parts, and wherein.

Figure 1:
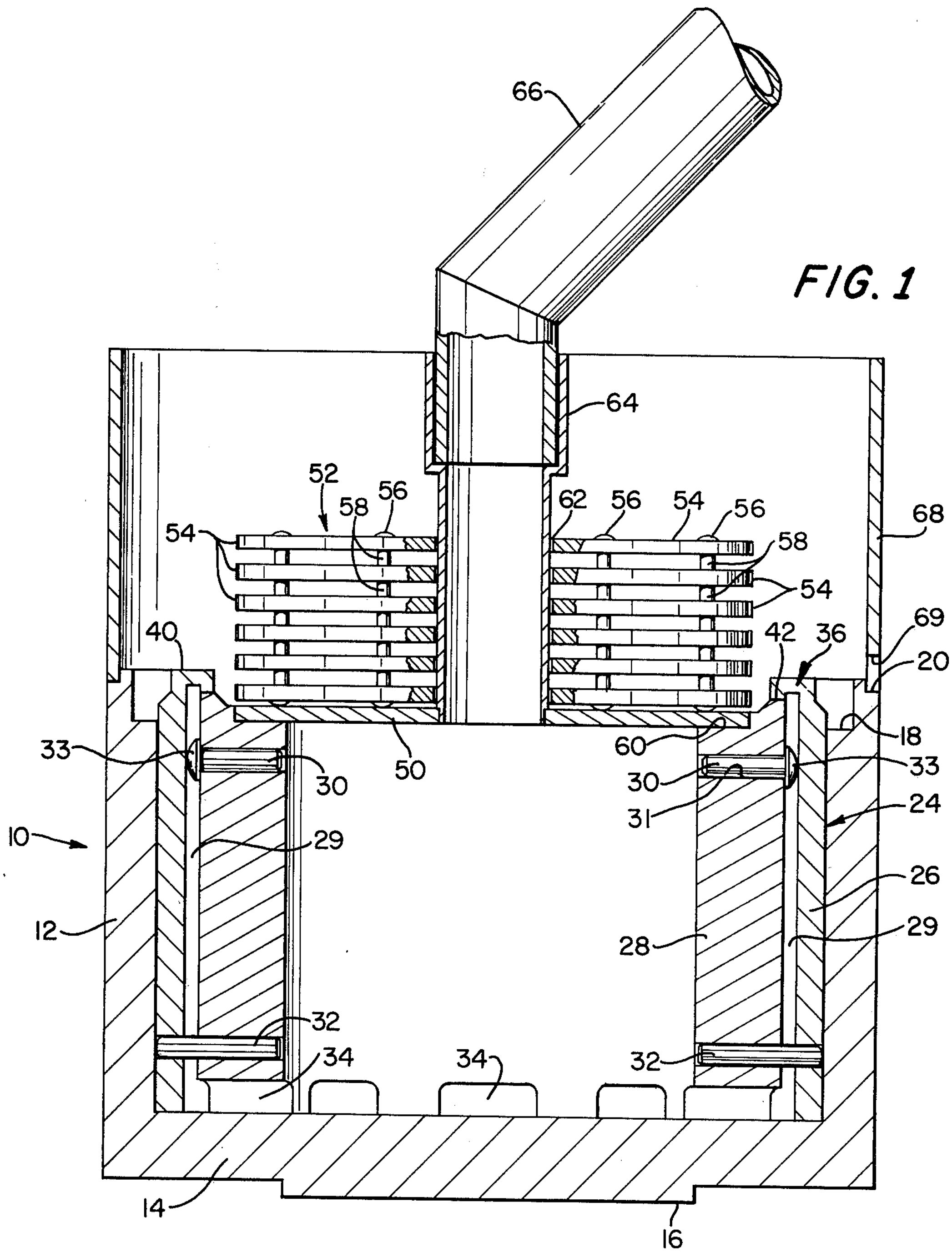
FIG. 1 is a side elevation, partly in section, of apparatus for growing a multiple of elongate, flat crystalline bodies, the apparatus comprising a multiple die assembly constructed in accordance with this invention combined with a crucible, radiation shield and feed tube.

FIG. 1 shows a preferred form of crucible-die assembly constructed in accordance with the present invention for growing sapphire ribbon. The illustrated apparatus includes a molybdenum crucible 10 which comprises a cylindrical sidewall 12 and a bottom wall 14. Bottom wall 14 is provided with a shoulder section as shown at 16 for mating with a supporting member (not shown) which is used to support the crucible within a suitable furnace enclosure (not shown). Details of a suitable furnace are shown in FIG. 1 of the aforesaid U.S. Pat. No. 3,591,348 which is incorporated herewith by reference. Crucible 10 is open at its top end, and its cylindrical sidewall 12 is undercut adjacent its top end to provide an interior annular shoulder 18 and an exterior annular shoulder 20, each spaced a short distance from the upper end of the crucible.

A die assembly indicated generally at 24 is disposed interiorly of crucible 10. The die assembly 24 comprises a pair of concentric, cylindrical sleeves 26 and 28 made of molybdenum. Sleeve 26 makes a close fit with the crucible and has an inside diameter greater than the outside diameter of the inner sleeve 28 so as to provide a gap 29 therebetween of capillary proportions. Outer sleeve 26 is maintained in concentric spaced relation with sleeve 28 by a plurality of spacer elements in the form of molybdenum rivets 30 which are disposed in holes 31 in sleeve 28 and have rounded heads 33 which engage the inner surface of sleeve 26. Rivets 30 may make a loose fit in holes 31 or may make a press-fit in the holes. Sleeves 26 and 28 are locked together by one or more molybdenum locking pins 32 that are press-fitted in aligned holes found in the two sleeves. Although not shown, it is also contemplated that outer and inner sleeves 26 and 28 may be maintained in concentric relation by other suitable means, e.g. by vertically extending ribs formed on one or the other of the confronting surfaces of sleeves 26 and 28, or by disposing a plurality of small diameter wires or rods of capillary dimension between the sleeves in accordance with the teachings of U.S. Pat. No. 3,687,633. Inner sleeve 28 is provided with one or more slots 34 adjacent its bottom end to permit inflow of melt to capillary 29.

Figure 2:
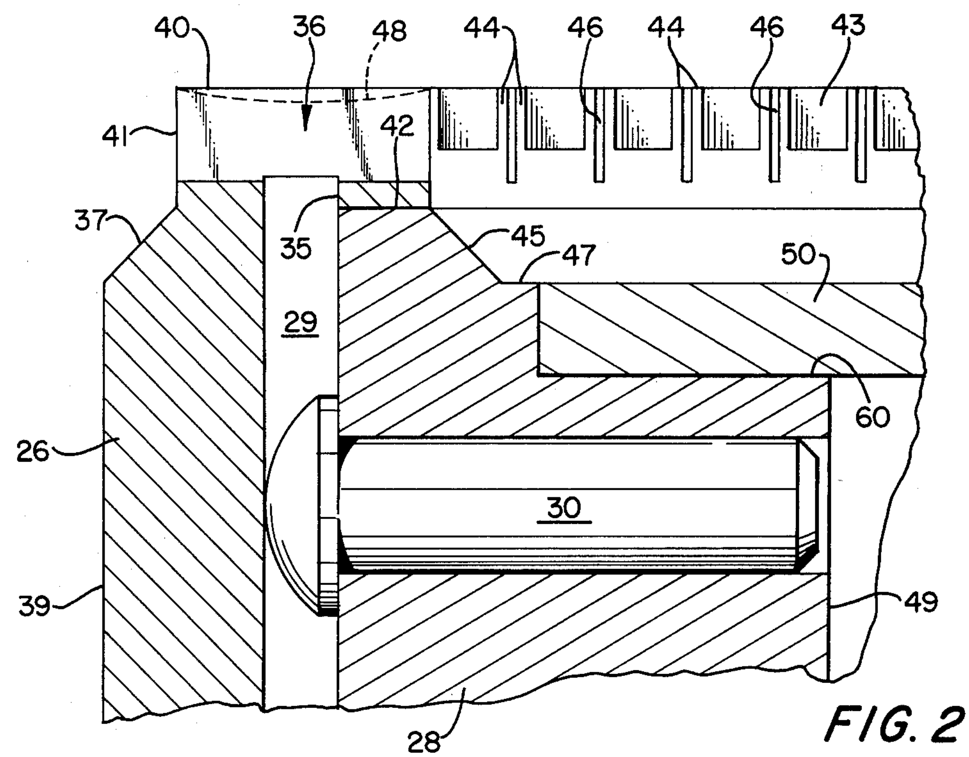
FIG. 2 is a sectional view in side elevation on a greatly enlarged scale of a portion of the upper end of the die assembly of FIG. 1.
Figure 3:
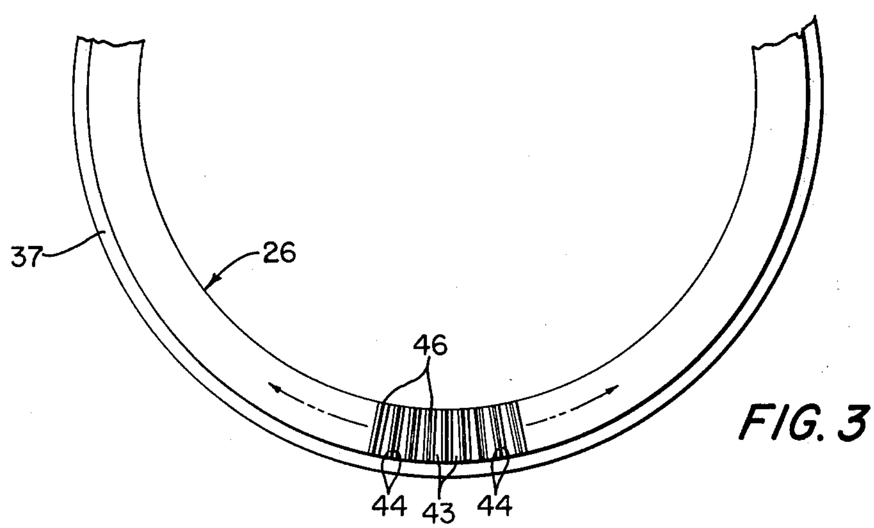
FIG. 3 is a plan view of a portion of the die assembly of FIG. 1.

Referring also to FIGS. 2 and 3, sleeves 26 and 28 are formed with substantially flat top end surfaces 40 and 42 respectively. Outer sleeve 26 is somewhat longer than inner sleeve 28 and is shaped so that its upper end is formed with an internal flange 36 which renders it generally L-shaped in longitudinal section. Flange 36 overhangs sleeve 28 and has a depending lip 35 which engages the upper end 42 of inner sleeve 28. Annular flange 36 is formed with a plurality of relatively wide radially-extending slots 43 which intersect the end surface 40 and subdivide the end of sleeve 26 into a plurality of like dies 44. Additionally flange 36 is formed with a series of relatively narrow radially extending slots 46 which also intersect the end surface 40 but are located so as to radially split each die 44 into two sections. The slots 46 are with a depth sufficient to intersect the upper end of the capillary gap 29 between the inner and outer sleeves. Additionally each slot 46 is formed with a width (the dimension between the two sections of the die) which is sized so that the slot will function as a capillary, whereby to assure that melt will flow from the lower capillary 29 up to the upper end of each die by action of capillary rise. As is well known in the art, the width of the slots 46 must be adjusted according to the surface tension of the melt material in order to provide the required capillary action.

As shown in FIGS. 1–3, the sleeve 26 has a reduced outer diameter at its upper end with an inclined shoulder 37 extending between the larger and smaller diameter sections 39 and 41 respectively, of its outer surface. The upper sloping inside surface 45 which is at approximately the same level as the outer sloping surface 37 of sleeve 36 and extends inwardly from the inner edge of surface 42 to another end surface 47 of sleeve 28, whereby the outer and inner ends of the dies 44 are spaced radially from the outer and inner surfaces 39 and 49 of sleeves 26 and 28 respectively. Spacing the dies radially from the crucible as described is advantageous in that it assures clearance between the crucible and the growing crystals. Spacing the dies radially outward from the inner surface of sleeve 28 allows room for a radiation shield and cover plate as hereinafter described. Also locating the dies as described facilitates maintenance of a uniform temperature distribution among the dies. Radial orientation of the dies also facilitates construction of the dies as will become clear from the description following. Although not shown it will be understood that the inner sleeve 28 may be the longer of the two sleeves. In such case the upper end of the inner sleeve will then have a generally L-shaped section which overhangs and engages the upper end of the shorter outer sleeve, and the dies would then be formed in the upper end portion of inner sleeve 28.

Referring again to FIG. 1, the assembly also includes a cover plate 50 in the form of an annular molybdenum disc. The cover plate is seated on interior annular shoulder 60 which is formed by milling away portions of the end surface 47 of inner sleeve 28. The apparatus also includes an upper radiation shield assembly 52 which rests on top of cover 50 and consists of one or more annular molybdenum discs 54 that are held together in spaced relation by means of stand offs which consist of pins 56 and tubular spacers 58 through which the pins extend. The outside diameters of disc 54 are substantially the same as crucible cover 50. Cover 50 and discs 54 have a plurality of aligned openings 62 which serve as an aperture through which a down-pipe 64 is fitted. The lower end of down-pipe 64 is fitted into cover 50 and its upper end is adapted for connection to a sloping charge-pipe 66, whereby particulate alumina may be supplied to the interior of the crucible to make up for material which is consumed during crystal growth. Completing the crucible and die assembly is a heat suscepter which consists of a tubular sleeve 68 which has an outer diameter substantially the same as that of crucible 10. Sleeve 68 makes a telescoping fit with the upper end of crucible sidewall 12 and rests on the shoulder 20 as shown. Sleeve 68 is made of molybdenum and has openings 69 through which growth of crystals can be observed.

The downpipe 64 and the charge pipe 66 must be large enough in diameter to assure proper flow of the alumina feed into the crucible. Accordingly, if the die assembly has a plurality of dies 44 formed around its entire circumference, a small number of the dies may not be used due to interference by the sloping downpipe. Thus, for example, in the case where a die assembly has an outside diameter of 2.5 inch and comprises 60 dies, it is possible to dimension and position the charge-pipe 66 so that 54 dies may be used for growing 54 ribbons simultaneously.

Figure 4:
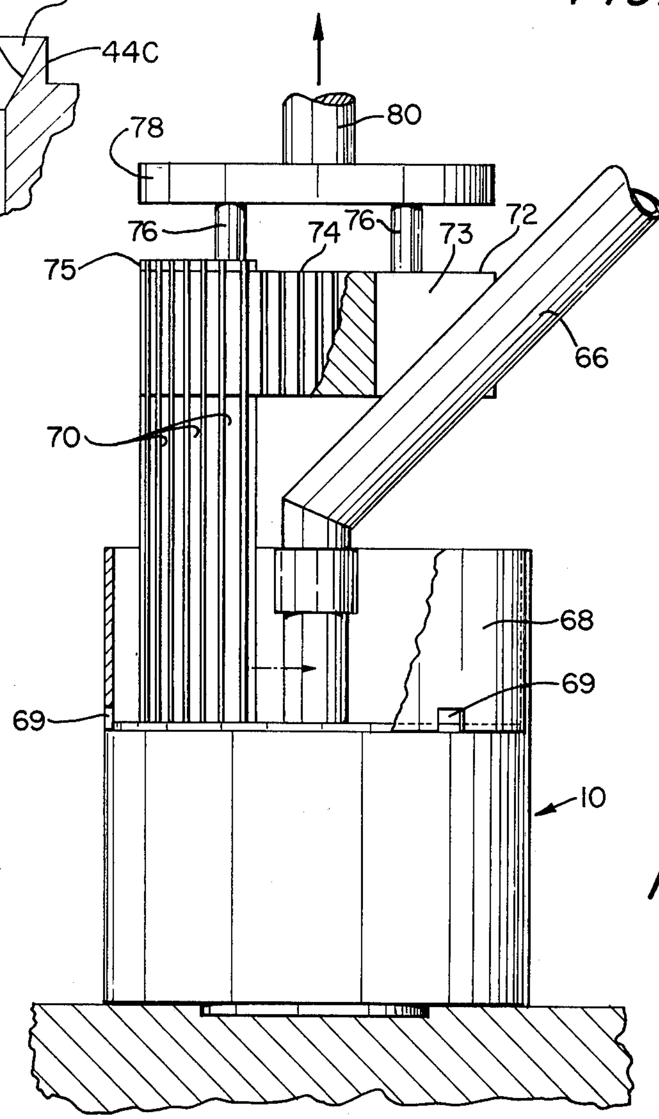
FIG. 4 is a side elevation, partly in section, of the apparatus of FIG. 1 combined with a crystal puller.

In this connection reference is had to FIG. 4 which discloses a preferred form of seed holder and puller for use with the crucible and die assembly above described. The seed holder and puller preferably comprises a holder in the form of a disc shaped member 72 which has an outer diameter substantially equal to the diameter of the outer surface of strip 28. The edge of holder 72 is formed with a relatively large slot 73 to accommodate the inclined charge-pipe 66. The edge of holder 72 also is formed with a plurality of relatively small slots 74, each adapted to receive and retain an elongate seed crystal 70. The slots 74 are spaced uniformly around the periphery of holder 72 and extend to either side of slot 73. Each of the slots 74 is aligned with one of the dies 44.

The holder 72 is mounted by means of a pair of rods 76 to a conventional pulling mechanism which is associated with a suitable crystal growing furnace, e.g. a furnace of the type shown in U.S. Pat. No. 3,591,984. The pulling mechanism is only partly shown in FIG. 4 and includes a support plate 78 and a pulling rod 80, the latter being connected to a suitable mechanically, hydraulically or electrically drawing means (not shown) which is adapted to vertically reciprocate the pulling load at a variable and preferably controlled speed.

It is to be noted that the crystal holder 72 and the support plate 78 could be provided with openings to accommodate a vertical or nearly vertical charge-pipe in place of the charge-pipe 66. In which case monocrystalline ribbons could be grown from dies located at different points around the full circumference of the die assembly.

Figure 5:
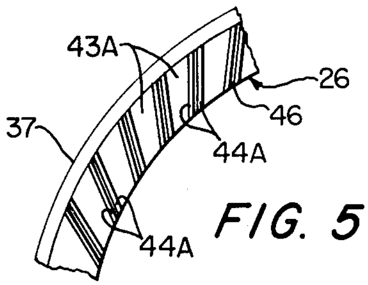
FIG. 5 is a plan view of a portion of an alternative design of a die assembly made in accordance with the present invention.

Following is an example of growing rectangular sapphire ribbon using the above-described apparatus. The crucible/die assembly is mounted in a furnace of the type shown in said U.S. Pat. No. 3,591,384. The die assembly comprises 60 discrete dies but charge tube 66 extends over and thus interferes with use of six of the dies. Accordingly, 54 single crystal seeds of pure alpha-alumina are mounted in the slotted holder 72. Seeds 70 are sized in cross-section so as to make a tight fit in slots 74 and the upper ends of the crystals are secured to an alumina collar 75, whereby the crystals are prevented from moving axially down through the slots during the pulling operation. The crystals 70 are aligned vertically with dies 44. The upper surface 40 of each die has a length of about 0.160 inch measured radially of sleeve 26 and a width of about 0.020 inch measured at a right angle to its length. The width of the capillary slot 46 is about 0.007 inch. The crucible is charged with substantially pure alpha-alumina and the furnace is swept with argon. The furnace is heated to a temperature slightly above the melting point of alumina, i.e. to about 2,070° C, whereby the alumina charge melts and molten alumina fills the lower capillary section 29 and the capillaries of dies 44. Once the die capillaries are filled, seed holder 72 is lowered so that the ends of the seed crystals 70 come into contact with the upper surfaces of the dies 44. The seed crystal ends which contact the upper surfaces of the dies melt to form a small area films of melt that merge with the melt in the capillaries. The seed holder 72 is then pulled up away from the upper end surfaces of the dies 44. The pulling speed is controlled to maintain a constant film thickness on the surface of the die in known manner whereby a plurality of sapphire ribbons of rectangular cross-section are grown simultaneously and in a single pulling operation. The apparatus just described has a number of advantages over the prior art. One advantage is that the apparatus of the present invention makes it possible to produce a substantially greater number of crystals in a single pulling operation than heretofore possible. Another advantage is seen in the manufacture of the die assembly itself which results from forming the die assembly in two parts and having two capillary sections. Thus, the lower capillary 29 may be formed without any extensive drilling operation since this capillary is simply the spacing between the two parts 26 and 28. The upper capillaries 46 and also the die edge surfaces may be formed by a single machining operation, e.g. with milling machine, cutting wheel of the like. Still another advantage of the present invention resides from locating the dies substantially radially in the upper end surface of the die which reduces temperature gradients in a direction transverse to the growth axis of the crystals. However, it should be noted that the dies do not have to be exactly radial. For example, the dies may be offset somewhat from a radial direction, as shown in FIG. 5 where the slots 43A are cut on a bias so that the dies 44A extend along chords of a circle concentric with sleeves 26 and 28. It will be appreciated, however, that in such an arrangement the dies still can be formed using conventional milling or cutting equipment. The dies shown in FIG. 5 have the additional advantage that, for a given die diameter, the width of the ribbons which can be formed will be somewhat greater. It is to be noted also that the upper end surfaces 40 of the dies do not need to be flat as shown but instead may be curved, for example, so that the profile of the long dimension of each die is concave as indicated by the dotted line 48 in FIG. 2. Concave end surfaces are useful in maximizing uniformity of crystal growth.

Figure 6:
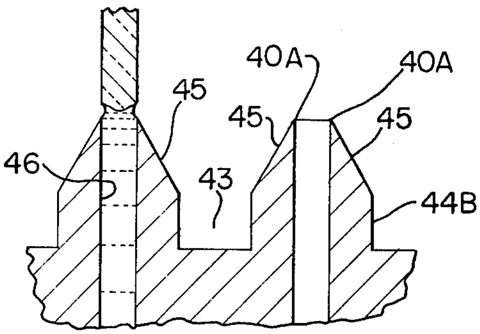
FIG. 6 is a sectional view in side elevation on a greatly enlarged scale of a portion of the upper end of an alternative die assembly in accordance with this invention.
Figure 7:
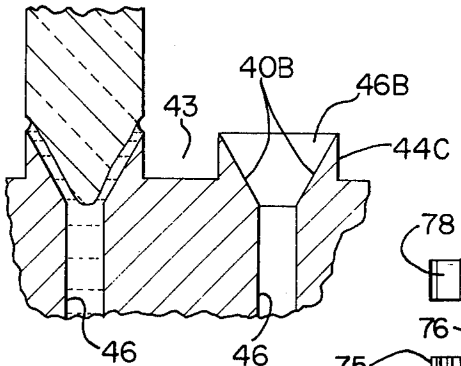
FIG. 7 is a sectional view in side elevation on a greatly enlarged scale of a portion of the upper end of another alternative die assembly in accordance with this invention.

FIGS. 6 and 7 illustrate other fomrs of dies made in accordance with the present invention. The dies shown in FIGS. 6 and 7 comprise inner and outer concentric members, similar to the dies shown in FIGS. 2 and 3 previously described in detail. However, the dies shown in FIGS. 6 and 7 differ from the dies shown in FIGS. 2 and 3 in the shape of the die top end surface.

The dies 44B illustrated in FIG. 6 are generally similar in construction to the dies shown in FIGS. 2 and 3, except that the upper end of each die is bevelled from a high point at the capillary slots 46, so that in place of the radially extending die top end surfaces 40 the forming surface of each die in FIG. 6 is defined by a pair of parallel sharp edge surfaces 40A formed at the intersection of inclined surfaces 45 with capillary slot 46. One skilled in the art will recognize that the modified dies shown in FIG. 6 are particularly adapted for growing relatively thin ribbon crystals at high growth rates.

The dies 44C illustrated in FIG. 7 also are generally similar in construction to the dies shown in FIGS. 2 and 3, except that the horizontal die top end surfaces 40 are replaced by inclined converging surfaces 40B forming radially-extending vee-shaped cavities or channels 46B communicating with the capillary slots 46. One skilled in the art will recognize that the modified dies shown in FIG. 7 are particularly adapted for growing relatively wide ribbon at suitable growth rates. A particular advantage of the modified dies of FIG. 7 is that the sloping surfaces 40B permit the crystal-melt interface to attain a more natural shape during growth and this in turn promotes better single crystal growth.

One skilled in the art will recognize that the crucible die arrangement above described may be used to grow crystalline materials other than alpha-alumina, e.g. other congruently and non-congruently melting materials such as aluminum garnet, lithium niobate, silicon and eutectic compositions. With respect to such other materials, the process is essentially the same as that described above for alpha-alumina, except that it requires different operating temperatures because of different melting points and possibly different crucible and die materials to avoid reaction with the melt and to assure proper wetting by the melt.

With respect to the die it is to be understood that in the following claims the terms "surface" as it pertains to a die member is intended to cover the effective film-supporting surface of that die member and includes the area of the upper end of the capillary, and the term "capillary" is intended to denote a passageway that can take a variety of forms. Also in referring to the film-supporting surfaces of the dies, the term "substantially flat" is to be understood as including surfaces that have a modest curvature as illustrated at 48 in FIG. 2.

What is claimed is:

1. Apparatus for use in growing crystalline bodies from the melt comprising a crucible open at the top and having a bottom wall and a side wall, and a die assembly disposed within said crucible, said die assembly comprising two separate parts in the form of inner and outer concentric members, said members being spaced with respect to one another to define a lower capillary passage having a bottom end that communicates with the interior space of said crucible adjacent said bottom wall, one of said members being longer than the other and having at its upper end an extension which overhangs and engages the upper end of said other member, said extension comprising first slots which subdivide said extension into a plurality of dies with top end surfaces and second slots in said dies which intersect the space between said inner and outer members and provide capillaries between said lower capillary passage and said top end surfaces of said dies.

2. Apparatus according to claim 1 further including spacer means between said inner and outer concentric members.

3. Apparatus according to claim 1 wherein said outer member is the longer of said two members, and said dies are formed in the upper end of said outer member.

4. Apparatus according to claim 1 wherein said outer member lies close to the inner surface of the side wall of said crucible.

5. Apparatus according to claim 1 wherein one of said members has one or more slots adjacent its bottom end to permit melt to flow from the interior of said crucible into the annular space between said inner and outer members.

6. Apparatus according to claim 1 wherein said dies are integral parts of said one member.

7. Apparatus according to claim 1 wherein said dies extend generally radially of said members.

8. Apparatus according to claim 7 wherein said extension is L-shaped in cross section.

9. Apparatus according to claim 1 further including a shoulder on the upper end of said other member, and a cover plate resting on said shoulder.

10. Apparatus according to claim 1 wherein said die top end surfaces comprises a pair of relatively narrow, generally radially extending, substantially flat surfaces.

11. Apparatus according to claim 1 wherein said die top end surfaces are shaped so that said second slots terminate in generally radially extending vee-shaped channels.

12. Apparatus according to claim 1 wherein each of said die top end surfaces comprises a pair of radially extending sharp edge surfaces.

13. Apparatus according to claim 1 further including a seed holder spaced from and disposed above the top end surfaces of said dies, said seed holder comprising a member having a plurality of openings for receiving seed crystals, said openings being aligned with said dies.

14. Apparatus according to claim 13 further including means for drawing said holder away from the top end surfaces of said dies in a vertical direction.

15. A die assembly for use in growing a plurality of crystalline bodies from the melt, said die assembly comprising inner and outer concentric sleeves, said sleeves being spaced with respect to tone another to define a capillary passage, and means locking said sleeves against relative movement, one of said sleeves being longer than the other sleeve and having at one end a radially extending flange which overlies and engages the corresponding end of the other sleeve, said flange comprising first slots which subdivide said flange into a plurality of dies with top end surfaces and second slots in said dies which intersect the passage between said inner and outer sleeves and provide capillaries leading from said capillary passage to the top end surfaces of said dies.

16. Apparatus according to claiim 15 further including spacer means between said sleeves.

17. Apparatus according to claim 15 wherein said dies are an integral part of said outer sleeve.

18. Apparatus according to claim 15 wherein said dies extend generally radially of said one sleeve.

19. Apparatus according to claim 15 wherein said dies have first and second opposite ends with said first end spaced radially inward of the outer surface of said outer sleeve and said second end being spaced radially outward of the inner surface of said inner sleeve.

20. Apparatus according to claim 15 wherein said end surfaces are concave in one dimension.

* * * * *